United States Patent [19]
Yamamura

[11] Patent Number: 5,509,019
[45] Date of Patent: Apr. 16, 1996

[54] SEMICONDUCTOR INTEGRATED CIRCUIT DEVICE HAVING TEST CONTROL CIRCUIT IN INPUT/OUTPUT AREA

[75] Inventor: Takeshi Yamamura, Kawasaki, Japan

[73] Assignee: Fujitsu Limited, Kawasaki, Japan

[21] Appl. No.: 312,062

[22] Filed: Sep. 26, 1994

Related U.S. Application Data

[63] Continuation of Ser. No. 849,439, Jun. 25, 1992, abandoned.

[30] Foreign Application Priority Data

Sep. 20, 1990 [JP] Japan ................................. 2-252526

[51] Int. Cl.⁶ .............................................. G11C 29/00
[52] U.S. Cl. .................... 371/21.1; 371/22.5; 371/22.6; 395/183.06; 324/765; 365/201
[58] Field of Search ............................... 371/21.1, 15.1, 371/25.1, 2.2, 10.1, 24, 22.5, 22.6, 22.3; 365/201, 200; 324/158, 765; 395/183.06

[56] References Cited

U.S. PATENT DOCUMENTS

| | | | |
|---|---|---|---|
| 4,241,307 | 12/1980 | Hong | 324/73 R |
| 4,413,271 | 11/1983 | Gontowski, Jr. et al. | 357/40 |
| 4,441,154 | 4/1984 | McDonough et al. | 395/800 |
| 4,527,234 | 7/1985 | Bellay | 364/200 |
| 4,837,765 | 6/1989 | Suzuki | 371/25 |
| 4,860,288 | 8/1989 | Teske et al. | 371/1 |
| 4,912,709 | 3/1990 | Teske et al. | 371/22.1 |
| 4,967,352 | 10/1990 | Keida et al. | 364/200 |
| 5,017,993 | 5/1991 | Shibata | 357/40 |
| 5,341,383 | 8/1994 | Shikatani et al. | 371/22.1 |

FOREIGN PATENT DOCUMENTS

| | | |
|---|---|---|
| 0255449A1 | 2/1988 | European Pat. Off. . |
| 60-103632 | 6/1985 | Japan . |
| 63-260145 | 10/1988 | Japan . |

OTHER PUBLICATIONS

Patent Abstracts of Japan, vol. 11, No. 5 (p–533), Jan. 8, 1987.
Patent Abstracts of Japan, vol. 7, No. 182 (E–192), Aug. 11, 1983.

*Primary Examiner*—Robert W. Beausoliel, Jr.
*Assistant Examiner*—Dieu-Minh Le
*Attorney, Agent, or Firm*—Nikaido, Marmelstein, Murray & Oram

[57] ABSTRACT

A semiconductor integrated circuit includes a chip (10a), a core area (12) on the chip in which tester circuits (14) are placed, and an I/O area (13) on the chip. The I/O area is provided at the periphery of the core area, and in the I/O area a plurality of tester circuits (17) are placed for testing the functions of respectively testee circuits in, respectively core area. The I/O area is provided with test control circuits (15) for supplying a control signal (C2) and a clock signal (C3), for testing said tester circuits, to the test circuits and testee circuits, on the basis of an external control signal supplied from outside.

26 Claims, 8 Drawing Sheets

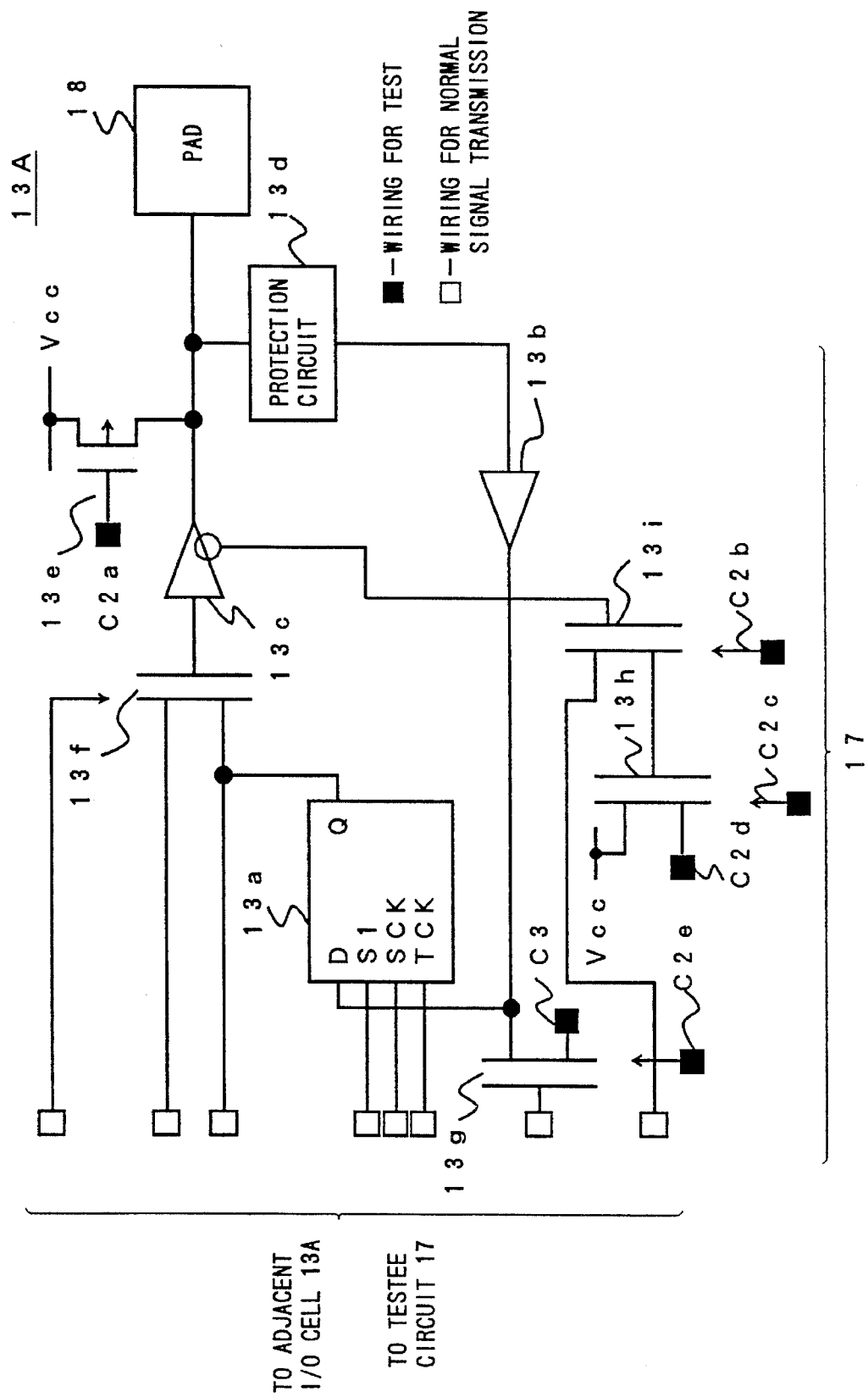

SEMICONDUCTOR INTEGRATED CIRCUIT DEVICE HAVING TEST CONTROL CIRCUIT IN INPUT/OUTPUT AREA

This application is a continuation of application Ser. No. 07/849,439 filed Jun. 25, 1992, now abandoned.

The present invention relates to a semiconductor integrated circuit device, and more specifically, to a semiconductors integrated circuit device equipped with test control circuits for testing functions of an internal circuit in a semiconductor integrated circuit.

With the recent trend for higher integration of semiconductor integrated circuit devices, various methods of examining an internal circuit have been in use. These include, 1. Internal scan method
2. Boundary scan method
3. Internal memory direct access method In an internal scan method, a flip-flop (hereinafter called an FF) is connected to a signal path called a scan chain, which is different from a path for use in normal operation and into which a control signal is input serially so as to set data in the FF, and a clock is output to the FF for data transfer so that the content of the FF only is read, thereby improving a failure detection rate. On the other hand, when a signal path for use in normal operation is used to detect an error in the FF, controlling a test signal is troublesome since, inevitably, the test signal passes through a logic unit either in setting data in the FF or in reading data set in the FF.

In a boundary scan method, FFs, placed in an I/O area and capable of accepting data from outside and of outputting data to the outside, are connected via a signal path called a boundary chain, so that data can be outputted serially in response to an input signal, thus enabling the reading of the contents of the chain of FFs. With this method, a pair of semiconductor integrated circuit devices, for example, can be configured such that the terminals of those semiconductor integrated circuit devices are connected, and data in an FF of one of the devices is transferred to an FF of another device, so that a check is made into whether the wiring between the two semiconductor integrated circuit devices is secure.

In an internal memory direct access method, a direct read/write operation of data is performed on a RAM in order to test the RAM operation: because, if a signal path for use in normal operation is used in testing a RAM in a semiconductor circuit device, a read/write operation is inevitably conducted via a logic unit, making it difficult to provide a specific test signal since providing the test signal that way must allow for a logical conversion at a logic unit. In the methods described above, clocks and data are delivered to the tester circuit via a path different from the ones used for normal operation, thereby necessitating provision of a selector for switching between the paths as shown in FIG. 1, and of a test control signal for operating this selector.

In a semiconductor integrated circuit device of high integration, the number of test control signal terminals to be implemented tend to total 10 to 20 in order to conduct a test on a semiconductor integrated circuit device. Further, providing a test signal via input pins of a semiconductor integrated circuit device in an unmodified configuration means a large increase in the pin count of the package.

Accordingly, it is recommended that a decoder circuit be provided, in a semiconductor integrated circuit device, for decoding a control signal supplied by as few as four input pins and providing the signal for a semiconductor integrated circuit device.

This requires a scan clock control circuit for controlling a scan clock and a memory test clock control circuit for controlling a test clock to be used in an internal memory test.

BACKGROUND ART

Conventional semiconductor integrated circuit devices of the type described above include the one shown in FIG. 2.

The area on a chip $1a$ of a semiconductor integrated circuit device 1 is divided roughly into a core area 2 and an I/O area 3. On the core area 2, testee circuits 4 and test control circuits 5 are provided.

In the I/O area 3, I/O cells 6, and tester circuits 7 are provided. The I/O cells 6, being connected to a pad 8 which is an I/O terminal for connection to the outside, include a buffer amplifier for storing and amplifying a signal when outputting a signal from the testee circuit 4 in the core area 2 to the outside and when inputting a signal from outside. An electrostatic destruction protection circuit called ESD is also provided for preventing the destruction of an internal circuit due to electrostatic from outside. $C_{in}$ is an external control signal provided from the outside and $C_{dc}$ is a test control signal as decoded by the test control circuits 5.

In this configuration, when conducting a test on functions of a semiconductor integrated circuit 1, the external control signal $C_{in}$ is given from outside and the test control signal $C_{dc}$ as decoded by the test control circuits 5, is output to the testee circuit 4 and the tester circuits 7 in the I/O area 3; various types of test including the above-described internal scan method, the boundary scan method and the internal memory direct access method are then conducted.

However, such a conventional semiconductor integrated circuit device 1 has a disadvantage: that the placing of the test control circuits 5 in the core area 2 necessitates securing an area in the core area 2 for placing the test control circuits 5 thereon, thus resulting in a larger chip size of a semiconductor integrated circuit device 1.

The conventional technology used also has a disadvantage in that it causes the laying out to become complex because a layout designer must take into account the disposition of the test control circuits 5. Particularly, when a user designs the core area 2, the presence of the test control circuits 5 in the core area 2 presents a problem. Normally, a user does not need the test control circuits 5. In many cases, it is a manufacturer of the semiconductor integrated circuit device 1 who uses the test control circuits 5. Forcing the user to design the core area 2 in consideration of the unnecessary test control circuits 5 is undesirable.

Moreover, the conventional device has a disadvantage in that it has a complicated wiring structure because the external control signal $C_{in}$ must be delivered to the core area 2 via a test control signal line distributed to the tester circuits 7 in the I/O area 3, resulting in complex wiring.

DISCLOSURE OF THE INVENTION

Accordingly, the present invention has the objects of providing a semiconductor integrated circuit device in which a chip size increase is prevented, and in making the device laying out easy as a result a test control signal line need not be distributed in a core area.

The objects of the present invention are achieved by a semiconductor integrated circuit device comprising a chip; a core area on the chip on which testee circuits having specific functions are placed; an I/O on the chip which area is located at the periphery of the core area and in which a plurality of tester circuits, for testing functions of the testee circuit in the core area, are placed, the I/O area being provided with test control circuits for delivering, on the basis of an external control signal coming from outside, a control signal and a clock signal for testing the testee circuit, to the tester circuit and the testee circuit.

BRIEF DESCRIPTION OF THE DRAWINGS

FIGS. 7A and 7B are block diagrams illustrating a configuration of an I/O cell of FIG. 4.

BEST MODE OF CARRYING OUT THE INVENTION

Figure 1:
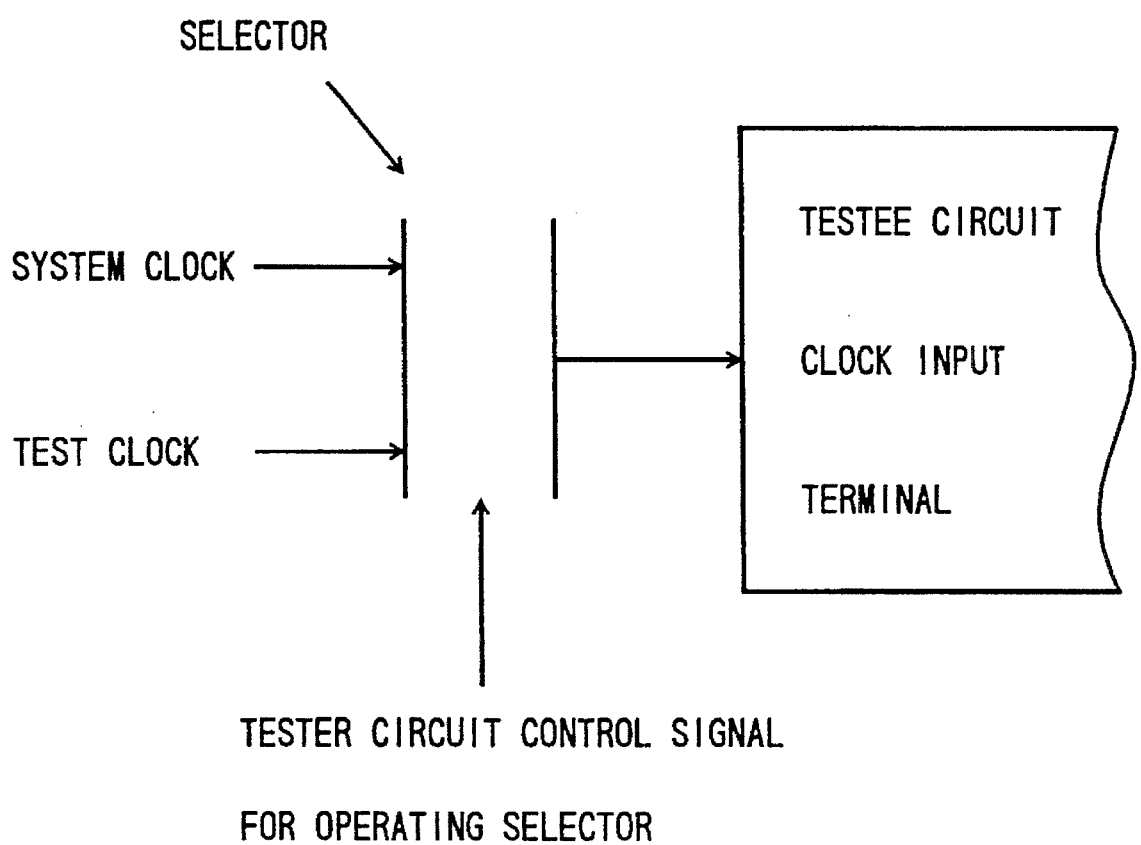
FIG. 1 is a diagram illustrating a switching performed by a selector.
Figure 2:
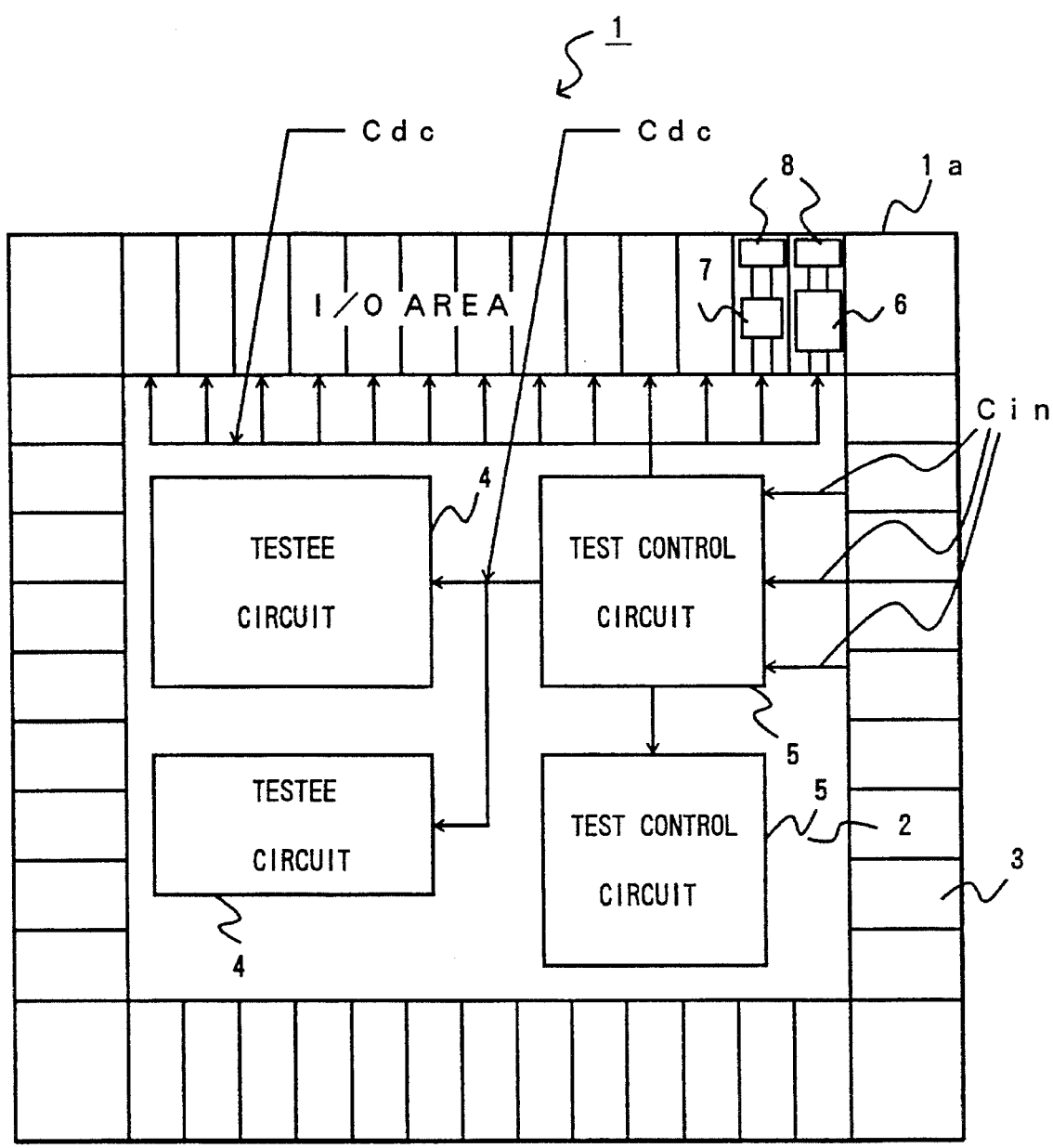
FIG. 2 is a top view illustrating an entire configuration of a conventional chip.
Figure 3:
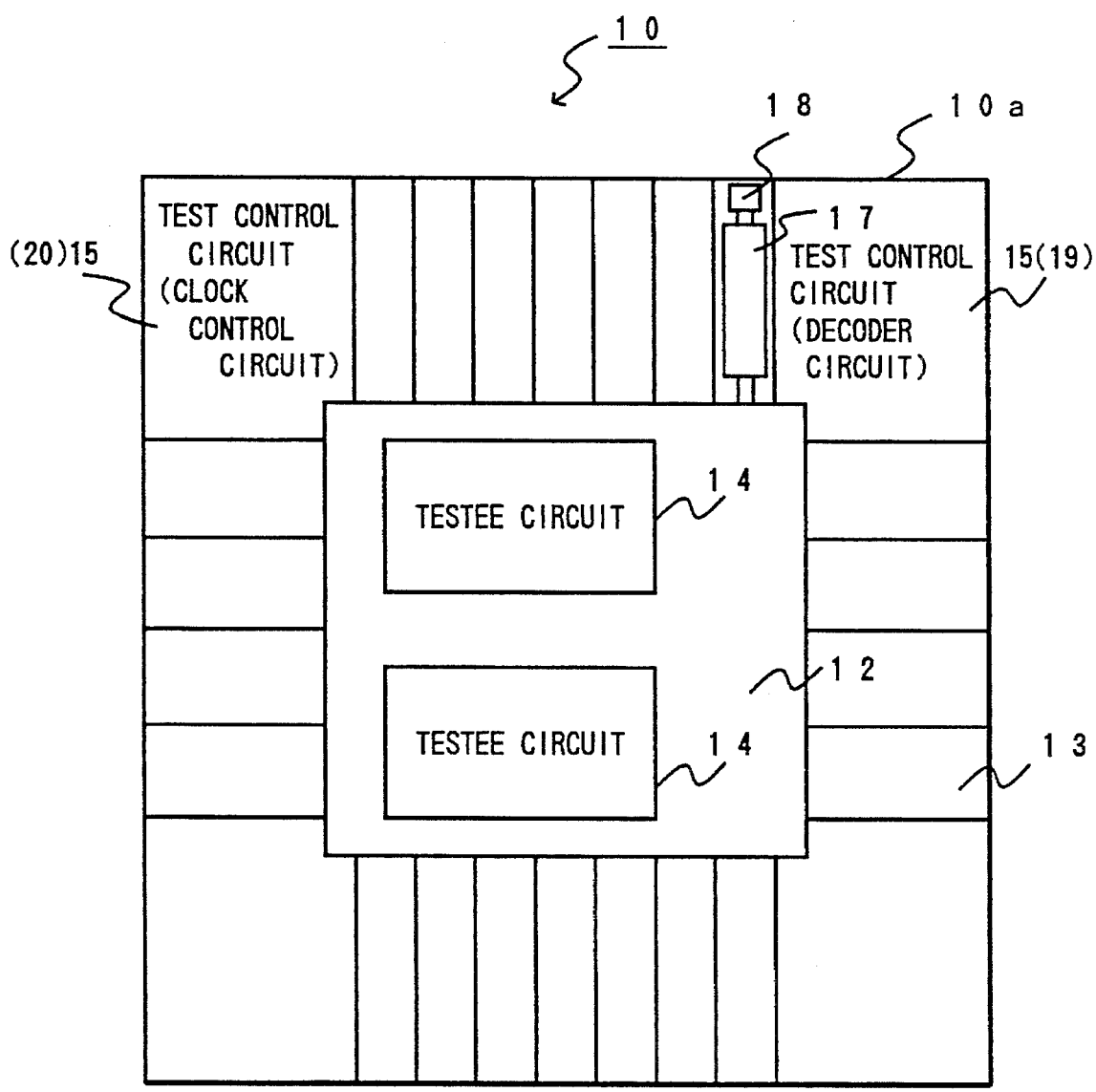
FIG. 3 is a diagram illustrating a principle of a semiconductor integrated circuit device of the present invention.

FIG. 3 is a diagram illustrating an overview of the present invention.

A semiconductor integrated circuit device 10 of the present invention is configured such that the semiconductor integrated circuit device comprises a core area 12 on a chip 10a on which testee circuits 14 are placed, and an I/O area 13 on which tester circuits 17 for testing functions of the testee circuits 14 on the core area 12 are placed. The test control circuits 15 are also placed in the I/O area which deliver, on the basis of an external control signal coming from outside, a specified control signal and a clock signal to the tester circuits 17 and the testee circuits 14.

As shown in the figure, the test control circuits 15 are placed on two separate corner portions of the chip 10a. In the upper right corner a decoder circuit 19 is placed and in the upper left corner a clock control circuit 20 is placed. That is, the test control circuits 15 are provided with the decoder circuit 19 and the clock control circuit 20.

The decoder circuit 19 decodes the external control signal coming from outside and outputs the resulting decoded signal to the tester circuits 17 and the testee circuits 14. The clock control circuit 20 outputs an external clock signal, on the basis of the control signal decoded by the decoder circuit 19, to the tester circuits 17 and the testee circuits 14. It is preferable, in conducting a test on the semiconductor integrated circuit device 10, that the configuration should be such that the test control circuits 15 output the control signal and the clock signal to the tester circuits 17 and testee circuit 14 via a signal path separate from those used for normal operation.

In the present invention the test control circuits 15 are placed in the I/O area 13 and only the testee circuits 14 having specific functions are placed in the core area 12. That is, an area in the core area for the placement of the test control circuits 15 is unnecessary, with the result that an increase is prevented in chip size of the semiconductor integrated circuit device 10; the space of the core area 12 is effectively utilized solely by the testee circuits 14 having specific functions, making the laying out easy to perform. The connection between the test control circuits 15 and the tester circuits 17 is made easy due to the fact that the test control circuits 15 and the tester circuits 17 are both placed in the I/O area 13. Although the test control circuits 15 can be placed at any portion of the I/O area 13, placing them at the corner portions of the chip 10a, as shown in FIG. 3, is preferable because of a large free area available.

Figure 4:
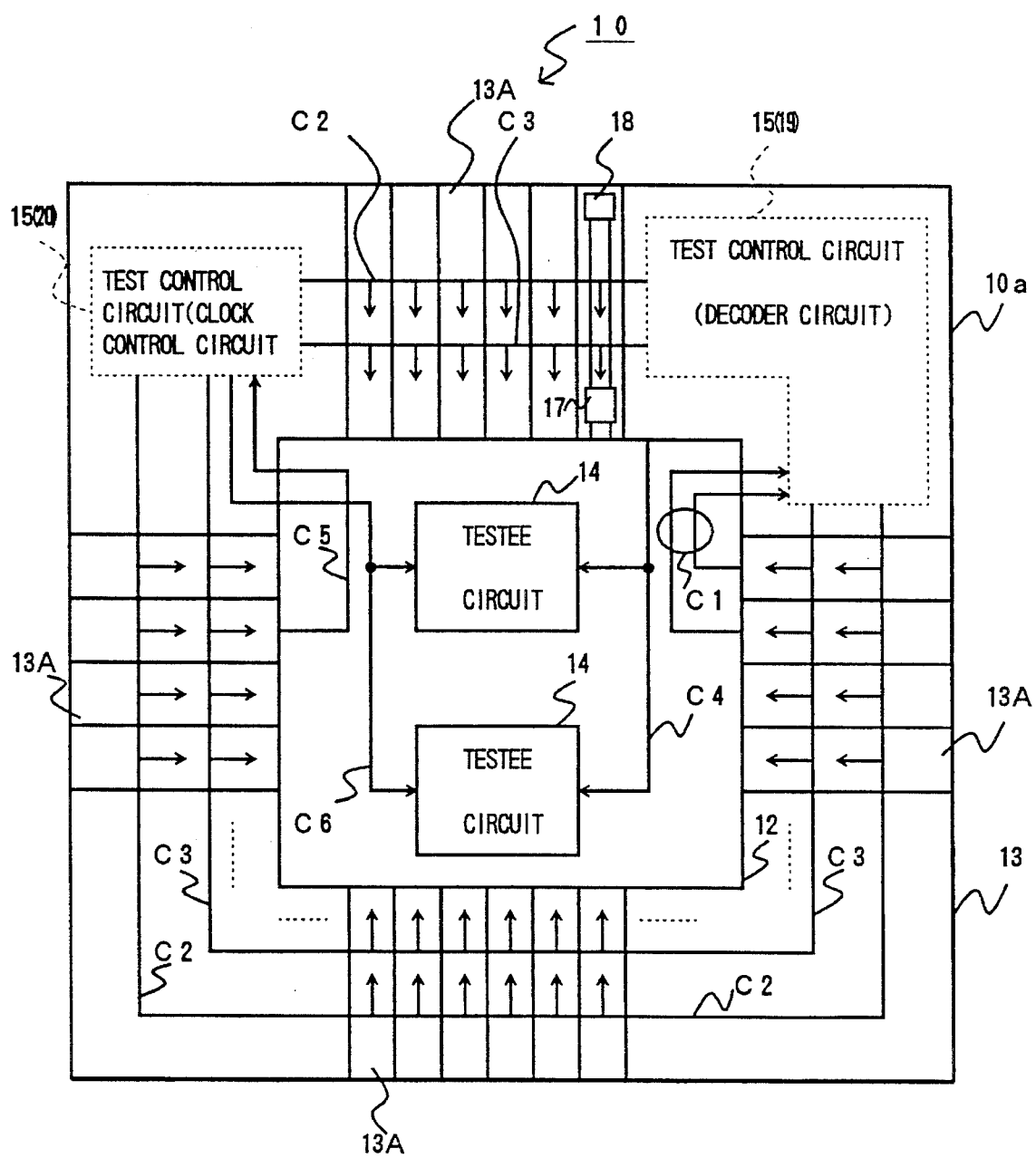
FIG. 4 is a top view illustrating an entire configuration of a chip of one embodiment of the present invention.

FIG. 4 is a top view of a semiconductor integrated circuit device 10 of one embodiment of the present invention. The area on the chip 10a consists of the core area 12 and the I/O area 13. In the core area the testee circuits 14 having specific functions are placed, and in two corners of the I/O area 13 the test control circuits 15 are placed. The test control circuits 15 comprise the decoder circuit 19 and the clock control circuit 20.

The decoder circuit 19 decodes an external control signal C1 coming from outside, and outputs the resulting decoded signals C2 and C4 to the tester circuits 17 and the testee circuits 14 respectively.

The clock control circuit 20 outputs, on the basis of the control signal C2 from the decoder circuit 19, an external clock signal C5 or an internally generated clock signal, to the tester circuits 17 and the testee circuits 14. In the figure, clock signals output from the clock control circuit 20 to the tester circuits 17 and the testee circuits 14 are shown as C3 and C6 respectively.

The clock control circuit 20 is equipped with either or both of the following circuits: a scan clock control circuit for controlling a scan clock to be used in the event that the aforementioned test methods, such as the internal scan method or the boundary scan method, are employed as a test method; and/or a memory test clock control circuit for controlling a test clock in the event that an internal memory direct access method is employed as a test method.

In the I/O area 13 a plurality of I/O cells 13A are arrayed. Each I/O cell 13A includes a pad 18, a tester circuit 17, and test wiring.

Figure 5A:
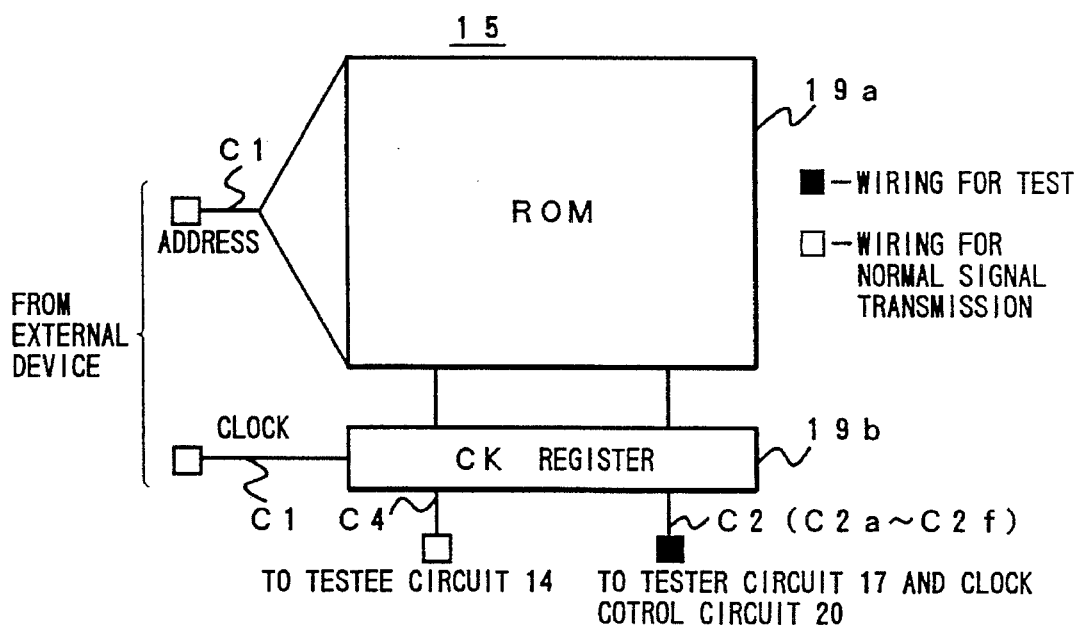
FIGS. 5A and 5B are block diagrams illustrating a decoder circuit in each of test control circuits of FIG. 4.

FIG. 5A is a block diagram illustrating the decoder circuit 19 of the test control circuit 15 shown in FIG. 4. The decoder circuit 19 consists of a ROM 19a into which specified data is written, and a register 19b. The ROM 19a, via the register 19b operating in synchronization with a clock signal portion of the external control signal C1, outputs the control signal C2 that is the portion of the external control signal C1, supplied from outside the semiconductor integrated circuit device 1, which corresponds to an address signal (consisting of a plurality of bits) of the ROM 19a, to each tester circuit 17 and the clock control circuit 20, and outputs the control signal C4 to each testee circuit 14. As will be described later, the control signal C2 includes control signals C2a–C2f.

Figure 5B:
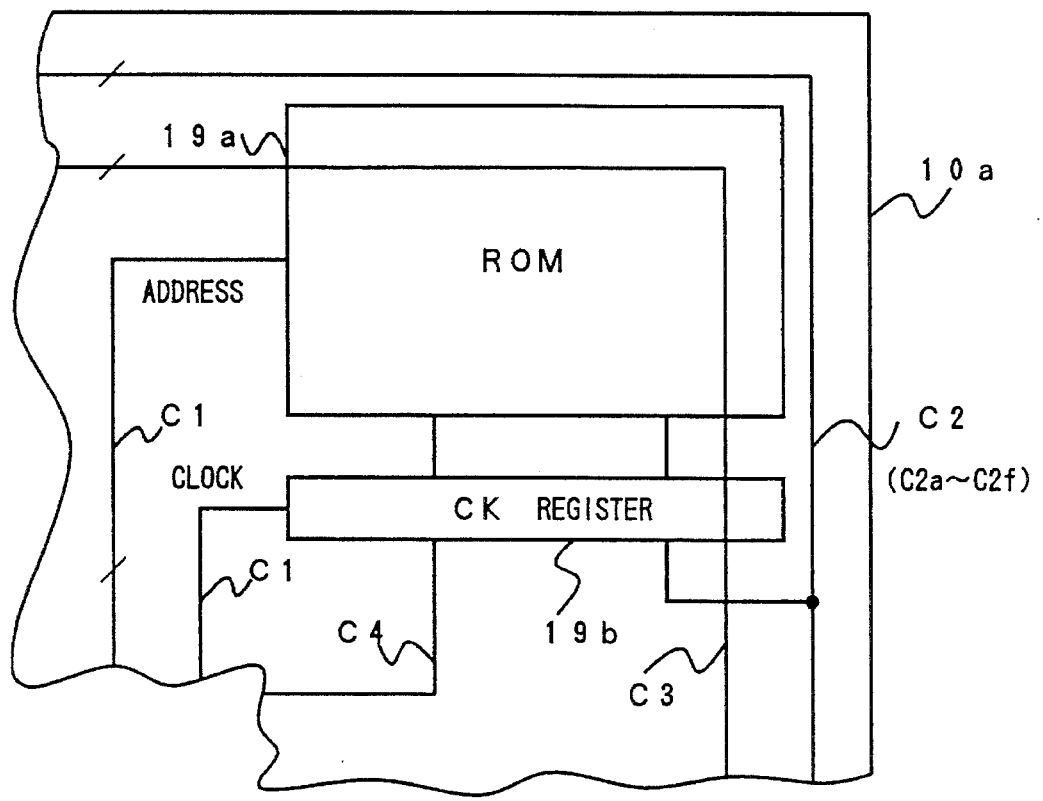

FIG. 5B is a block diagram illustrating a layout of the decoder circuit 19 shown in FIG. 5A. Near the corner of the chip 10a the ROM 19a is placed, and the register 19b is adjacent to the ROM 19a.

Figure 6A:
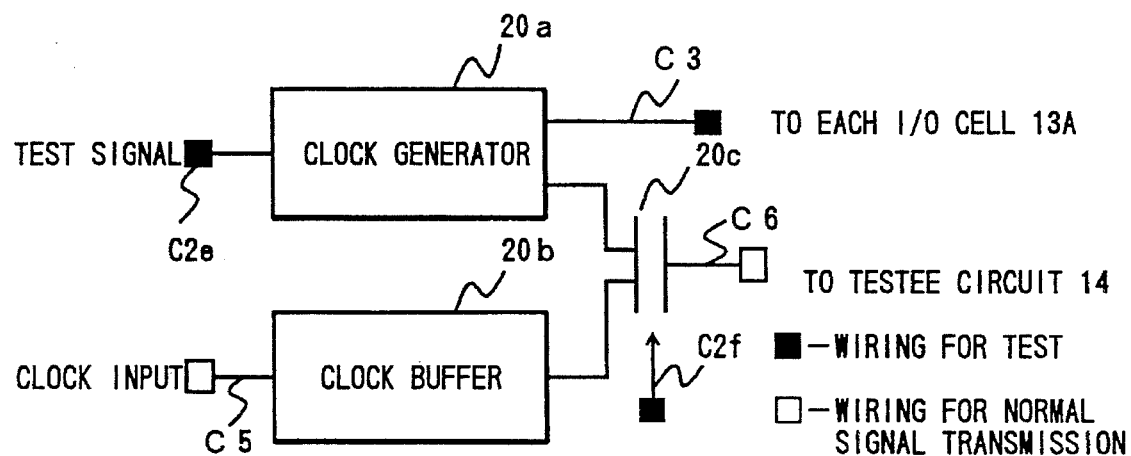
FIGS. 6A and 6B are block diagrams illustrating a clock control circuit in the test control circuit of FIG. 4.

FIG. 6A is a block diagram of the clock control circuit 20 shown in FIG. 4. The clock control circuit 20 comprises a clock generator 20a, a clock buffer 20b, and a selector 20c. The clock generator 20a selectively generates various clock signals for test use, in accordance with a test control signal C2f output by the ROM 19a in FIG. 5A. The clock buffer 20b temporarily retains various external clock signals C5 and outputs them to the selector 20C. The selector 20c selects between the clock signal C3 generated by the clock generator 20a and the clock signal from the clock buffer 20b, and outputs either of the two to each testee circuit 14, in accordance with the control signal C2f output by the ROM 19a of FIG. 4A. The clock signal C3 generated by the clock generator 20a is supplied to each I/O cell 13A.

Figure 6B:
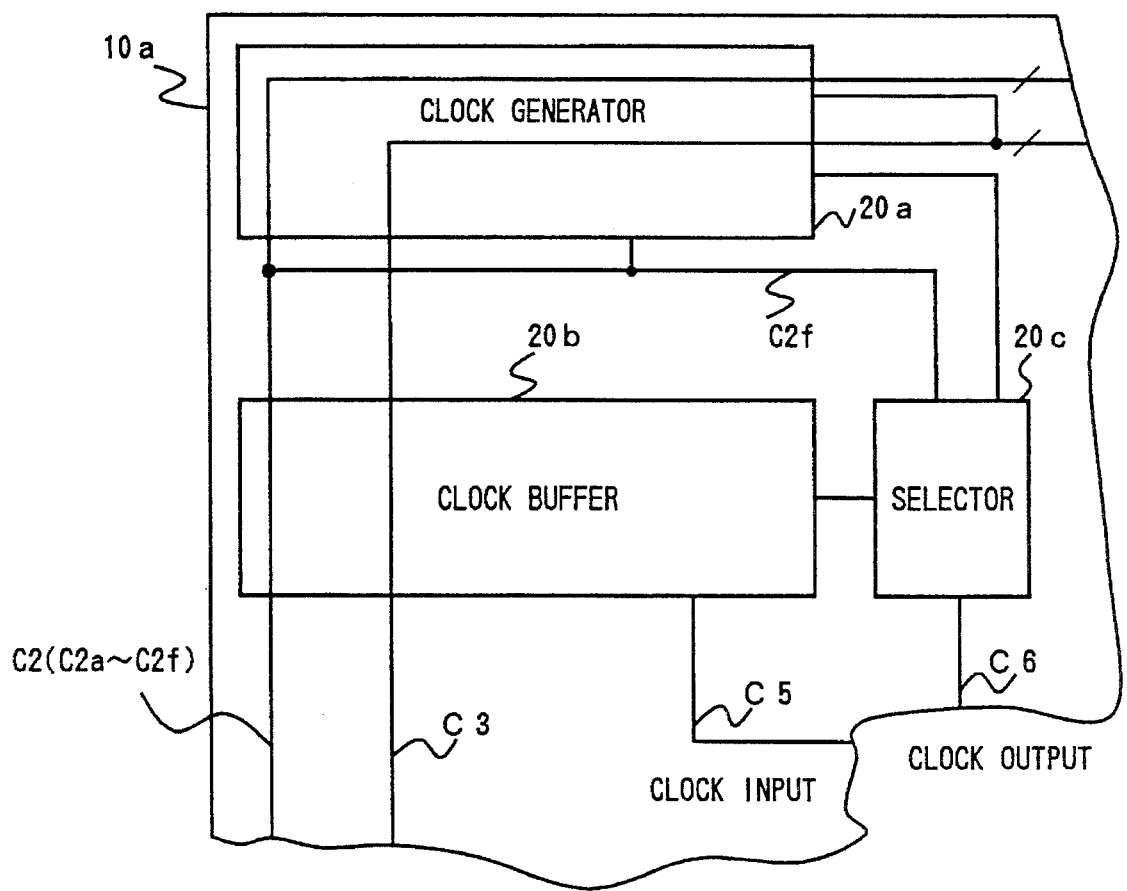

FIG. 6B is a block diagram illustrating a layout of the clock control circuit 20 shown in FIG. 6A. Near the corner of the chip 10a the clock generator 20a is placed, and the clock buffer 20b and the selector 20c are placed in the vicinity thereof, as shown in the figure.

FIG. 7A is a block diagram illustrating the tester circuit 17 provided in each I/O cell 13A. The tester circuit 17 comprises a scan flip-flop (hereinafter simply called the flip-flop) 13a, an input circuit 13b, an output circuit 13c composed of tristate inverters, a protection circuit 13d, a pull-up transistor 13e, and selectors 13f–13i. The flip-flop 13a is used in a boundary scan test in such a way that the flip-flop is synchronized with a scan clock signal provided at a SCK (scan clock) terminal while a SI (scan-in) terminal is maintained active, and the flip-flop latches a test data, from the pad 18 or the preceding I/O cell 17A, in a D (data) terminal via the selector 13f, the output circuit 13c, the protection circuit 13d, and the input circuit 13b. A test is conducted in such a way that after the test data is latched in the flip-flop 13a in each I/O cell 17A, a pulse of the test clock is provided at a TCK (test clock) terminal, and the latched data is read sequentially via a terminal Q. The SI, SCK, and TCK of each I/O cell 17A are connected with each other, and are provided sequentially with a corresponding signal from outside.

The selector 13g selectively outputs a signal from the input circuit 13b or the clock signal C3 generated by the clock generator 20a of FIG. 6A to the testee circuit 17, in accordance with the control signal C2e output by the ROM 19a of FIG. 5A. The selector 13h selects either the control signal C2d output by the ROM 19a in order to control the status of the output circuit 13c, or a power supply voltage Vcc, in accordance with the control signal C2e from the ROM 19a of FIG. 5A, and outputs the selected one of the signal or the power supply voltage Vcc to the selector 13i. The selector 13i selects, on the basis of the control signal C2b output by the ROM 19a in FIG. 5A, between a signal from the testee circuit 17A and a signal from the selector 13h, and outputs the selected signal to the output circuit 13c. The pull-up transistor 13e selectively connects the pad 18 to the power supply line Vcc, in accordance with the control signal C2a from the ROM 19a.

Figure 7B:
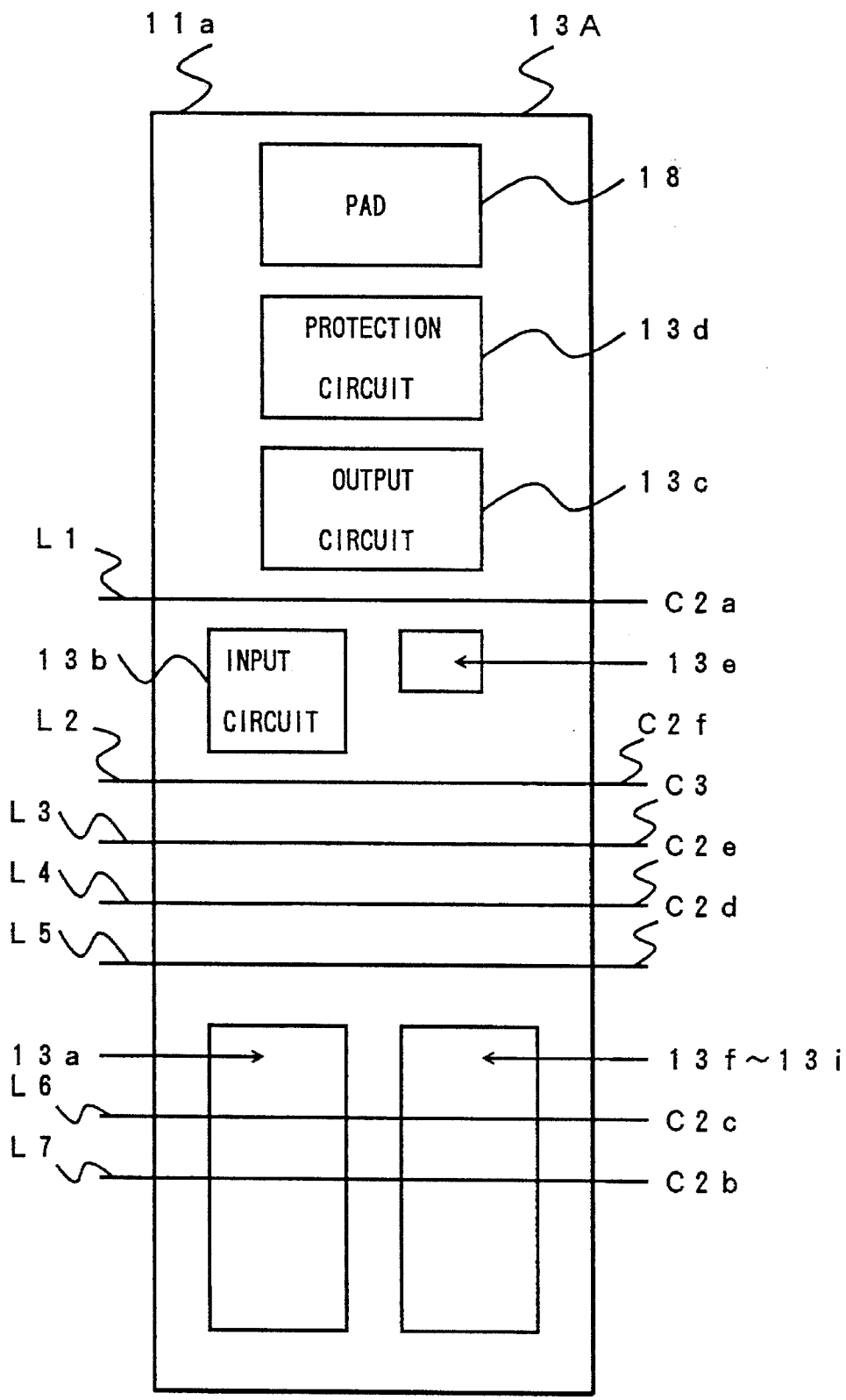

FIG. 7B is block diagram illustrating a layout of the tester circuit 17 of FIG. 7A. As shown in the figure, starting from near the periphery of the chip 10a, the pad 18, the protection circuit 13d, the output circuit 13c, the input circuit 13b, the pull-up circuit 13e, the flip-flop 13a, and the selectors 13f–13i are arrayed. On the tester circuit 17, the wirings L1–L7 are formed. The wiring L1 carries the control signal C2a and the wiring L2 carries the control signal C2f. The wiring L3 carries the clock signal C3 generated by the clock generator 20a of FIG. 6A, and the clock signal C3 including a scan-in signal, the scan clock signal, and a test clock signal from the clock buffer 20b. The wiring L4 carries the control signal C2e, and the wiring L5 carries the control signal C2d. The wiring L6 carries the control signal C2c, and the wiring L7 carries the control signal C2b. Each of respective components of the wirings L1–L7 and the tester circuit 13A are connected as shown in FIG. 7A, although this is not shown in FIG. 7B.

When conducting a test to examine functions of the semiconductor integrated circuit device 10, an external control signal C1 is supplied to the decoder circuit 19 from outside to be decoded by the decoder circuit 19 into test control signals C2a–C2f, which test control signals are output to the tester circuits 17 in the I/O area 13. The test control signal C2e is output to the clock control circuit 20; the test control signal C6 is output to the testee circuit 14 in the core area 12; the test clock signal C5, which is supplied from outside to the clock control circuit 20, is output as the clock signal C3 supplied from the clock control circuit 20 to the tester circuits 17 in the I/O area 13, and as the clock signal C6 supplied to the testee circuit 14 in the core area 12, permitting the conducting of various tests including the above-described internal scan method, the boundary method, or the internal memory direct access method. Thus, in case a test method is employed where a scan chain is formed, a scan chain is formed within the I/O area 3 alone.

Thus, the present invention eliminates the need of space in the core area 12 for the test control circuits 15, thus permitting an effective utilization of the space in the core area 12 solely by the testee circuits 14 having specific functions. The present invention further permits the placement of both the test control circuits 15 and the tester circuits 17 in the I/O area 13 so that an increase in chip size of the semiconductor integrated circuit device 10 is prevented, and thus results in an easy-to-do layout with easy connection between the test control circuits 15 and the tester circuits 17.

Consequently, a semiconductor integrated circuit device can be configured such that an increase in chip size is prevented, the laying out is easy to do, and the test control signal lines need not be distributed in the core area 12.

Moreover, the placement of both the test control circuits 15 and the tester circuits 17 in the I/O area 13 does not require placing the test control circuits 15, which are unnecessary for the user, in the core area 12 which may be desired for self-design by the use. Therefore the incorporation use of the test control circuits 15 need not be a burden to the user.

While the above-mentioned embodiment was explained by using an example case where the test control circuits 15 are placed at the corner of the I/O area 13, the test control circuits 15 can also be placed at other portions of the I/O area 13, if it is allowable to sacrifice low pin count in the I/O area 13.

POSSIBLE APPLICATION IN INDUSTRY

The present invention makes it unnecessary to provide a space for the test control circuits in the core area, and prevents an increase in chip size of the semiconductor integrated circuit device.

The core area is effectively utilized solely by the testee circuits having specific functions, making the layout easy to perform. Both the test control circuits and the tester circuits are placed in the I/O area so that the connection between the test control circuits and the tester circuits is easy.

Accordingly, an increase in chip size is prevented, while permitting the provision of a semiconductor device in which the layout is easy to perform and the distribution of the test control signal lines in the core area is not required.

I claim:

1. A semiconductor integrated circuit device, comprising:

a chip having at least first and second corner areas;

a core area on said chip on which testee circuits having specific functions are placed;

an I/O area on said chip located at a periphery of said core area;

a plurality of tester circuits located in said I/O area, and and selectively connected to said testee circuits in said core area, for testing the functions of said testee circuits in said core area; and test control circuits located in said I/O area and connected to said testee circuits and said tester circuits, for supplying a test control signal and a test clock signal to said tester and testee circuits, for testing said testee circuits on the basis of an external control signal coming from outside.

2. A semiconductor integrated circuit device as claimed in claim 1, wherein said test control circuits include:

decoding means for decoding said external control signal and generating said test control signal as a result of decoding, and clock control means for outputting said test clock signal based upon a portion of said test control signal generated by said decoding means.

3. A semiconductor integrated circuit device as claimed in claim 2, wherein said decoding means is located in the first corner area of said chip and said clock control means is located in a second corner area of said chip.

4. A semiconductor integrated circuit device as claimed in claim 1, wherein said I/O area includes wirings for transmitting said test control signal and said test clock signal.

5. A semiconductor integrated circuit device as claimed in claim 1, wherein:

said I/O area is formed a plurality of I/O cells, each of said I/O cells comprises one of said plurality of tester circuits, a pad, and an interface circuit connecting each of said testee circuits to a pad of a corresponding I/O cell.

6. A semiconductor integrated circuit device as claimed in claim 2, wherein:

said decoding means comprises a ROM for storing said test control signal; and said external control signal is an address signal for said ROM.

7. A semiconductor integrated circuit device as claimed in claim 2, wherein said clock control means includes clock generation means for generating a specified test clock signal in accordance with a corresponding control signal.

8. A semiconductor integrated circuit device as claimed in claim 2, wherein said clock control means includes buffer means for outputting an external clock signal supplied from outside to each of said plurality of testee circuits.

9. A semiconductor integrated circuit device as claimed in claim 7, wherein said clock control means includes clock generation means for generating a specified test clock signal in accordance with a corresponding control signal, buffer means for outputting an external clock signal supplied from outside to each of said plurality of tester circuits, and selection means for selectively outputting, to each of said testee circuits, at least one of the external clock signal supplied from outside and said test clock signal.

10. A semiconductor integrated circuit device as claimed in claim 9, wherein said selection means is controlled by a control signal corresponding to said selection means.

11. A semiconductor integrated circuit device as claimed in claim 5, wherein each of said I/O cells includes a flip-flop for test use, the flip-flops of said I/O cells being connected to each other in parallel.

12. A semiconductor integrated circuit device as claimed in claim 5, wherein the interface circuit of each of said I/O cells comprises a tristate buffer and each of said I/O cells further includes controlling means for controlling said tristate buffer based upon said test control signal.

13. A semiconductor integrated circuit device as claimed in claim 5, wherein each of said I/O cells further includes a pull-up transistor, each said pull-up transistor setting said pad at a specified power supply voltage based upon said control signal.

14. A semiconductor integrated circuit device as claimed in claim 5, wherein each of said I/O cells outputs at least one of a signal from said interface circuit or said test clock signal to a corresponding testee circuit based upon said test control signal.

15. A semiconductor integrated circuit device having defined thereon a core area and an I/O area located at a periphery of the core area, the I/O area having at least first and second corner portions, said semiconductor device comprising:

a plurality of testee circuits located in the core area and having specific functions;

a plurality of tester circuits located in the I/O area and selectively connected to said testee circuits in said core area, for testing the functions of said plurality of testee circuits in the core area;

a test control decoding circuit located in the first corner portion of the I/O area, for decoding an external control signal and generating a test control signal so as to control the plurality of tester circuits; and a test control clock circuit located in the second corner portion of the I/O area, for generating a test clock signal based on the control signal generated by said test control decoding circuit.

16. A semiconductor integrated circuit device as claimed in claim 15, wherein said test control decoding and clock circuits include wirings for transmitting the test control signal and the test clock signal.

17. A semiconductor integrated circuit device as claimed in claim 15, further comprising:

a plurality of I/O cells, each of said I/O cells includes one of said plurality of tester circuits, a pad, and an interface circuit connecting each of said plurality of testee circuits to a pad of a corresponding I/O cell.

18. A semiconductor integrated circuit device as claimed in claim 15, wherein said test control decoding circuit includes a ROM for storing the test control signal, and the external control signal is an address signal for the ROM.

19. A semiconductor integrated circuit device as claimed in claim 15, wherein said test control clock circuit is further for generating a specified test clock signal in accordance with a corresponding control signal.

20. A semiconductor integrated circuit device as claimed in claim 15, wherein said test control clock circuit includes buffer means for receiving an external clock signal and outputting the external clock signal to each of said plurality of testee circuits.

21. A semiconductor integrated circuit device as claimed in claim 15, wherein said test control clock circuit includes clock generation means for generating a specified test clock signal in accordance with a corresponding control signal, buffer means for receiving an external clock signal, and selection means for selectively outputting, to each of said testee circuits, at least one of the external clock signal and said test clock signal.

22. A semiconductor integrated circuit device as claimed in claim 21, wherein said selection means is controlled by a control signal directed to said selection means.

23. A semiconductor integrated circuit device as claimed in claim 17, wherein each of said plurality of I/O cells includes a flip-flop for test use, the flip-flops of said I/O cells being connected to each other in parallel.

24. A semiconductor integrated circuit device as claimed in claim 17, wherein the interface circuit of each of said plurality of I/O cells includes a tristate buffer, and controlling means for controlling the tristate buffer based on the control signal from the test control decoding circuit.

25. A semiconductor integrated circuit device as claimed in claim 17, wherein each of said plurality of I/O cells further includes a pull-up transistor, each the pull-up transistors being connected to set the pad at a specified power supply voltage based on the the control signal from the test control decoding circuit.

26. A semiconductor integrated circuit device as claimed in claim 17, wherein each of said plurality of I/O cells outputs at least one of a signal from the interface circuit or the test clock signal to a corresponding testee circuit based on the test control signal from the test control decoding circuit.

* * * * *